United States Patent
Konno et al.

(10) Patent No.: US 8,664,663 B2
(45) Date of Patent: Mar. 4, 2014

(54) NITRIDE SEMICONDUCTOR TEMPLATE AND LIGHT-EMITTING DIODE INCLUDING OXYGEN-DOPED LAYER AND SILICON-DOPED LAYER FORMED ON THE OXYGEN-DOPED LAYER

(75) Inventors: Taichiroo Konno, Hitachi (JP); Hajime Fujikura, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 13/571,535

(22) Filed: Aug. 10, 2012

(65) Prior Publication Data

US 2013/0048942 A1 Feb. 28, 2013

(30) Foreign Application Priority Data

Aug. 22, 2011 (JP) .................. 2011-180303

(51) Int. Cl.
*H01L 29/15* (2006.01)
(52) U.S. Cl.
USPC .......................................................... 257/76
(58) Field of Classification Search
USPC ........... 257/13, 79, 83, 87, 94, 98, 99, 80, 88, 257/103, 615, E21.121, E21.125, E21.127
See application file for complete search history.

(56) References Cited

U.S. PATENT DOCUMENTS

| 6,441,393 B2 * | 8/2002 | Goetz et al. ............ 257/13 |
| 6,812,051 B2 | 11/2004 | Usui et al. |
| 7,053,420 B2 | 5/2006 | Tadatomo et al. |
| 2011/0284895 A1 * | 11/2011 | Hsu ........................ 257/98 |
| 2012/0193637 A1 * | 8/2012 | Kalnitsky et al. ....... 257/76 |

FOREIGN PATENT DOCUMENTS

| JP | 2002-280611 A | 9/2002 |
| JP | 3886341 B2 | 2/2007 |

* cited by examiner

*Primary Examiner* — Selim Ahmed

(74) *Attorney, Agent, or Firm* — McGinn Intellectual Property Law Group, PLLC

(57) ABSTRACT

A nitride semiconductor template includes a substrate, and a group III nitride semiconductor layer having an oxygen-doped layer formed on the substrate, and a silicon-doped layer formed on the oxygen-doped layer. A total thickness of the group III nitride semiconductor layer is not smaller than 4 µm and not greater than 10 µm, and an average silicon carrier concentration in the silicon-doped layer is not lower than $1\times10^{18}$ cm$^{-3}$ and not higher than $5\times10^{18}$ cm$^{-3}$.

20 Claims, 10 Drawing Sheets

- 10 NITRIDE SEMICONDUCTOR TEMPLATE
- 14 Si-DOPED GaN LAYER
- 13 O-DOPED GaN LAYER
- 12 AlN BUFFER LAYER
- 11 PSS SUBSTRATE

- 11a PROTRUDING PORTION
- 13
- 12
- 11

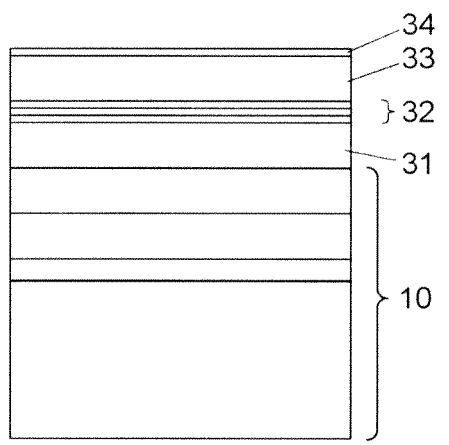
FIG.2 30 LIGHT-EMITTING DIODE EPITAXIAL WAFER

NITRIDE SEMICONDUCTOR TEMPLATE AND LIGHT-EMITTING DIODE INCLUDING OXYGEN-DOPED LAYER AND SILICON-DOPED LAYER FORMED ON THE OXYGEN-DOPED LAYER

The present application is based on Japanese patent application No. 2011-80303 filed on Aug. 22, 2011, the entire contents of which are incorporated herein by reference.

BACKGROUND OF THE INVENTION

1. Field of the Invention

This invention relates to a nitride semiconductor template and a light-emitting diode.

2. Description of the Related Art

Gallium nitride compound semiconductors, such as gallium nitride (GaN), aluminum gallium nitride (AlGaN), and indium gallium nitride (InGaN) have attracted attention as light-emitting device materials capable of red through ultraviolet light emission. One growing method for these gallium nitride compound semiconductor crystals is a Hydride Vapor Phase Epitaxy (HVPE) growing method using metal chloride gas and ammonia as raw material.

A feature of the HVPE method is as follows. According to this method, it is possible to obtain a growth rate of 10 μm/hr to 100 μm/hr or higher which is remarkably higher than a typical growth rate of several μm/hr in other growing methods such as Metal Organic Vapor Phase Epitaxy (MOVPE) and Molecular Beam Epitaxy (MBE). For this reason, the HVPE method has been often used in the manufacture of a GaN free-standing substrate (see e.g. JP Patent No. 3886341) and an AlN free-standing substrate. Here, the term "free-standing substrate" refers to a substrate having such strength to hold its own shape and not to cause inconvenience in handling.

In addition, a light-emitting diode (LED) made of a nitride semiconductor is typically formed on a sapphire substrate. In its crystal growth, after a buffer layer is formed on a surface of the substrate, a thick GaN layer having a thickness of about 10 to 15 μm including an n-type layer is grown thereon, and an InGaN/GaN multiple quantum well light-emitting layer (several hundreds nm thick in total) and a p-type layer (200 to 500 nm thick) are grown thereon in this order. The GaN layer under the light-emitting layer is thick in order to improve the crystallinity of GaN on the sapphire substrate and the like. This is followed by electrode formation, resulting in a final device structure as shown in FIG. 3 which will be described later. In the case of growth with the MOVPE method, the crystal growth typically requires about 6 hours, and about half of 6 hours is the time required to grow a so-called "template portion" that are nitride semiconductor layer(s) e.g. GaN layer(s) under the light-emitting layer.

From the above, if it is possible to apply the HVPE method with the remarkably high growth rate to the growth of the template, it will be possible to substantially shorten the growth time, thereby dramatically reduce LED wafer manufacturing cost.

On the other hand, one example of technique for improving the light extraction efficiency by reducing the optical confinement in the semiconductor light-emitting device is disclosed by e.g. JP-A-2002-280611.

In JP-A-2002-280611, a first layer is surface-roughened to increase the light extraction efficiency to provide high brightness. Also, in JP-A-2002-280611, a substrate is surface-roughened to have the aforementioned effect. JP-A-2002-280611 uses a so-called PSS (Patterned Sapphire Substrate), so as to increase the light extraction efficiency to provide the high brightness.

In addition, since the template portion is a portion through which electric current flows laterally, the template portion is required to be low in resistance. It is because the driving voltage (forward voltage) of the LED will be high, if the resistance of the template portion is not low. That is, the template portion is an important part which has both a role to improve the crystallinity, thereby lessen crystal defects in an active layer and enhance the internal quantum efficiency, and a role to lower the forward voltage.

SUMMARY OF THE INVENTION

As a general technique for realizing the low-resistance, there is a technique of increasing the amount of additive impurities to increase the carrier concentration. However, if the amount of additive impurities is excessive, the crystallinity will be deteriorated and the mobility will worsen, so that the resistance will be increased adversely. For this reason, it is desirable to lower the resistance without doping an excessive amount of additive impurities. In other words, it is desirable to lower the resistance without increasing the carrier concentration. In particular, it is difficult to realize both of the low the resistance and the low carrier concentration with using the HYPE method which is capable of lowering production cost.

Through the specification and claims, the "nitride semiconductor template" or simply "template" means a device which includes a substrate and nitride semiconductor layer(s) e.g. GaN layers to be provided under a light-emitting layer, and may further include a buffer layer or the like. Further, the "template portion" means the nitride semiconductor layer(s) in the "nitride semiconductor template".

Accordingly, it is an object of the present invention to provide a nitride semiconductor template with low resistance and good crystallinity, and a light-emitting diode using the nitride semiconductor template.

As a result of earnest study to achieve the above described problem, the inventors have found that the dislocation density can be reduced by initially growing the gallium nitride semiconductor into an island shape. In addition, the Inventors found that variously orientated surfaces appear during growing in the island shape, and when such surfaces are tilted, O (oxygen) doping efficiency is good. Based on these findings, the Inventors obtained a successful result to lessen the amount of additives that is one of causes of the defect formation. The O (oxygen) which is an n-type additive can be added in a good state without degrading the crystallinity, so that the resistance can be lowered to some extent. For this reason, the Inventors could further reduce the amount of the additive for the n-type doped layer which is positively doped, and also reduce the dislocation density. That is, using the HVPE method, the nitride semiconductor template is successfully provided with lower resistance and less defects.

According to a feature of the invention, a nitride semiconductor template comprises:

a substrate; and a group III nitride semiconductor layer comprising an oxygen-doped layer formed on the substrate, and a silicon-doped layer formed on the oxygen-doped layer, in which a total thickness of the group III nitride semiconductor layer is not smaller than 4 μm and not greater than 10 μm, and in which an average silicon carrier concentration in the silicon-doped layer is not lower than $1\times10^{18}$ cm$^{-3}$ and not higher than $5\times10^{18}$ cm$^{-3}$.

An oxygen impurity concentration in the oxygen-doped layer is preferably not lower than $1\times10^{16}$ cm$^{-3}$ and not higher than $3\times10^{19}$ cm$^{-3}$, and an average carrier concentration in the oxygen-doped layer is preferably is not lower than $0.8\times10^{18}$ cm$^{-3}$ and not higher than $1\times10^{18}$ cm$^{-3}$.

A surface resistivity is preferably not less than 10 Ω/sq and not more than 20 Ω/sq.

A full width at half maximum (FWHM) of a (0004) plane of X-ray diffraction (XRD) is preferably not less than 50 seconds and not more than 100 seconds.

A group III nitride semiconductor layer is a GaN-based layer.

The nitride semiconductor template may further comprise an aluminum nitride buffer layer between the GaN-based layer and the substrate.

A thickness of the aluminum nitride buffer layer is preferably not less than 10 nm and not more than 100 nm.

A surface of the substrate may comprise a plurality of protrusions.

The group III nitride semiconductor layer may be grown by Hydride Vapor Phase Epitaxy (HVPE).

According to another feature of the invention, a light-emitting diode comprises:

a sapphire substrate;

an aluminum nitride buffer layer formed on the sapphire substrate;

an n-type group III nitride semiconductor layer formed on the aluminum nitride buffer layer;

a multiple quantum well layer formed on the n-type group III nitride semiconductor layer;

a p-type nitride semiconductor layer formed on the multiple quantum well layer;

an exposed portion of the n-type group III nitride semiconductor layer formed by etching from the p-type nitride semiconductor layer to the n-type group III nitride semiconductor layer;

an n-type electrode formed on the exposed portion of the n-type group III nitride semiconductor layer; and a p-type electrode formed on the p-type nitride semiconductor layer, in which the n-type group III nitride semiconductor layer comprises a stacked structure comprising an oxygen-doped layer formed on the aluminum nitride buffer layer, and a silicon-doped layer formed on the oxygen-doped layer, in which a total thickness of the group III nitride semiconductor layer is not smaller than 4 μm and not greater than 10 μm, and in which an average silicon carrier concentration in the silicon doped layer is not lower than $1\times10^{18}$ cm$^{-3}$ and not higher than $5\times10^{18}$ cm$^{-3}$.

It should be noted that in one embodiment of the present invention, the nitride semiconductor template may be configured as follows. The plurality of protruding portions of the substrate may be shaped into a pyramid, cone or hemisphere. The protruding portions of the substrate have preferably a pitch (p) of 0.5 to 6.0 μm, and a height (h) of 0.5 to 3.0 μm in, as shown in FIG. 1B.

EFFECTS OF THE INVENTION

According to the present invention, it is possible to provide the nitride semiconductor template which is low in resistance, i.e. not more than 20 Ω/sq in surface resistivity, and which is excellent in crystallinity, i.e. a full width at half maximum (FWHM) of a (0004) plane in X-ray diffraction (XRD) measurement (hereinafter referred to as "XRD half width") is not less than 50 seconds and not more than 100 seconds. It is also possible to provide the light-emitting diode using the nitride semiconductor template.

BRIEF DESCRIPTION OF THE DRAWINGS

The preferred embodiments according to the invention will be explained below referring to the appended drawings, wherein:

FIG. 2 is a cross-sectional view of a light-emitting diode epitaxial wafer in a second embodiment according to the present invention;

DETAILED DESCRIPTION OF THE PREFERRED EMBODIMENTS

Summary of the Embodiment

A nitride semiconductor template in this embodiment comprises a substrate; and a group III nitride semiconductor layer comprising an oxygen (O)-doped layer formed on the substrate, and a silicon (Si)-doped layer formed on the O-doped layer. A total thickness of the group III nitride semiconductor layer is not smaller than 4 μm and not greater than 10 μm. An average Si carrier concentration in the Si-doped layer of the group III nitride semiconductor layer is not lower than $1\times10^{18}$ cm$^{-3}$ and not higher than $5\times10^{18}$ cm$^{-3}$.

The nitride semiconductor template comprises a plurality of nitride semiconductor layers formed on a heterogeneous substrate, and made of a homogeneous material different from that of the heterogeneous substrate. The total thickness of the group III nitride semiconductor layer is not smaller than 4 μm and not greater than 10 μm, so that its resistance can sufficiently be lowered even when the carrier concentration is low. The average carrier concentration in the Si-doped layer is low, i.e. not lower than $1\times10^{18}$ cm$^{-3}$ and not higher than $5\times10^{18}$ cm$^{-3}$, so that it is possible to suppress the deterioration in crystallinity.

(First Embodiment)

Figure 1A:
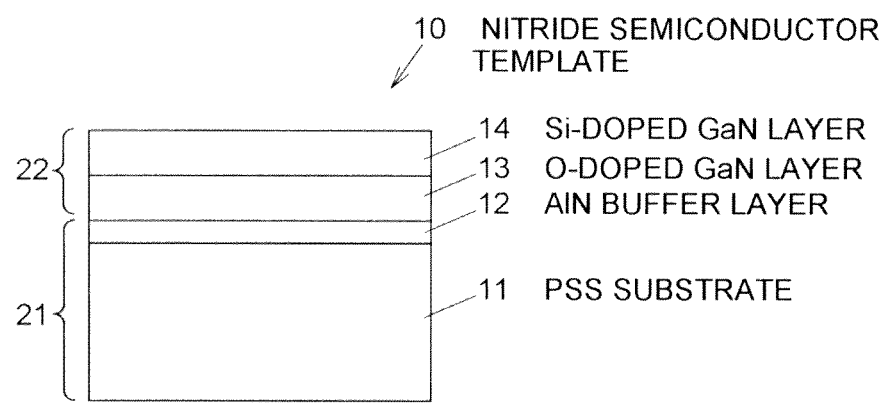
FIG. 1A is a cross-sectional view showing a nitride semiconductor template in a first embodiment according to the present invention.
Figure 1B:
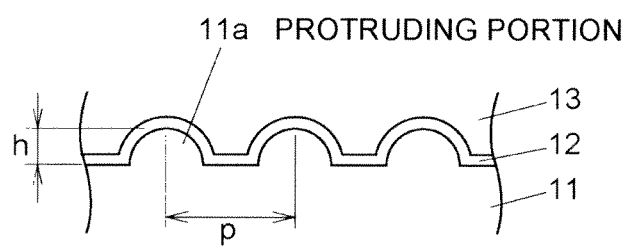
FIG. 1B is a cross-sectional view showing a state of an essential portion of a surface of a substrate.

FIG. 1A is a cross-sectional view showing a nitride semiconductor template 10 in a first embodiment according to the invention, and FIG. 1B is a cross-sectional view showing a state of an essential portion of a surface of a substrate.

Referring to FIG. 1A, a nitride semiconductor template 10 comprises a buffer layer-including PSS (Patterned Sapphire Substrate) substrate 21 in which an aluminum nitride (AlN) buffer layer 12 is previously formed on a patterned surface sapphire substrate, i.e. PSS substrate 11, an O-doped GaN layer 13 which is an O-doped layer doped with oxygen (O) and formed as a first layer on the buffer layer-including PSS substrate 21, and a Si-doped GaN layer 14 which is a Si-doped layer doped with silicon (Si) and formed as a second layer on the O-doped GaN layer 13. The O-doped GaN layer 13 and the Si-doped GaN layer 14 are an example of a group-III nitride semiconductor layer 22.

The PSS substrate 11 has a plurality of protruding portions 11a on the surface as shown in FIG. 1B, from the viewpoint of reduction of dislocation density based on island growth, etc. A pitch p of the protruding portions 11a is preferably 0.5 to 6.0 μm, more preferably 1.0 to 5.0 μm. A height h of the protruding portion 11a is preferably 0.5 to 3.0 μm, more preferably 1.0 to 2.5 μm. The shape of the protruding portion 11a may be any protruding, e.g. pyramidal, conical, or semi-spherical. The significance of the numerical range of the protruding portion 11a will be described later.

A film thickness of the AlN buffer layer 12 is preferably 10 to 100 nm, from the viewpoint of the suppression of crystal defects, etc. The significance of the numerical range of the film thickness of the AlN buffer layer 12 will be described later.

A total thickness of the O-doped GaN layer 13 as the first layer and the Si-doped GaN layer 14 as the second layer is preferably not smaller than 4 μm and not greater than 10 μm, more preferably 5 to 9 μm, from the viewpoint of the crystallinity and the lower resistance, and the like. In addition, a surface resistivity of the entire nitride semiconductor template 10 (the entire epitaxial layer) is preferably not less than 10 Ω/sq and not more than 20 Ω/sq, from the viewpoint of lower operating voltage, etc.

The O impurity concentration in the O-doped GaN layer 13 is preferably $1 \times 10^{16}$ to $3 \times 10^{19}$ cm$^{-3}$, more preferably $0.9 \times 10^{18}$ to $3 \times 10^{19}$ cm$^{-3}$, from the viewpoint of the crystallinity, lower resistance, and the like. In particular, the maximum impurity concentration of oxygen (O) contained in the O-doped layer 13 is preferably $0.9 \times 10^{18}$ to $3 \times 10^{19}$ cm$^{-3}$. The average carrier concentration of the O-doped GaN layer 13 is preferably $0.8 \times 10^{18}$ to $1 \times 10^{18}$ cm$^{-3}$.

The average carrier concentration of the Si-doped GaN layer 14 is preferably $1 \times 10^{18}$ to $5 \times 10^{18}$ cm$^{-3}$, more preferably $1 \times 10^{18}$ to $4 \times 10^{18}$ cm$^{-3}$, from the viewpoint of the crystallinity and the lower resistance, and the like.

(The Significance of the Numerical Range of the Protruding Portion of the Substrate)

If the pitch p of the protruding portions 11a of the surface of the PSS substrate 11 is too narrow, it will be difficult to narrow the XRD half width which is an indicator of the crystallinity. It is because that the initial island growth is lessened, thereby causing the early flattening. In addition, if the pitch p of the protruding portions 11a is too wide, pits will tend to occur.

If the height h of the protruding portion 11a is too low, it will be difficult to narrow the XRD half width. It is because that the same effect as the island growth is provided when the height h of the protruding portion 11a is high. On the contrary, if the height h of the protruding portion 11a is too high, it will be difficult to achieve the flattening, so that the pits tend to occur. For this reason, it is necessary to grow a film with a large film thickness so as to eliminate the pits. The large film thickness, however, causes the problem of a large warping of the wafer.

Thus, the pitch p of the protruding portion 11a is preferably 0.5 to 6.0 μm, more preferably 1.0 to 5.0 μm. In addition, the height h of the protruding portion 11a is preferably 0.5 to 3.0 μm, more preferably 1.0 to 2.5 μm.

(The Significance of the Numerical Range of the AlN Buffer Layer)

If a film thickness of the AlN buffer layer 12 is too thin or too thick, the crystal defects will be increased so that the XRD half width which is an indicator of the crystallinity will be broadened. For this reason, the film thickness of the AlN buffer layer 12 is set to be a reasonable value range as described above.

(The Significance of the Numerical Range of Film Thickness)

The total film thickness of the O-doped GaN layer 13 as the first layer and the Si-doped GaN layer 14 as the second layer is determined for the following reasons. If the total film thickness of the O-doped GaN layer 13 as the first layer and the Si-doped GaN layer 14 as the second layer is less than 4 μm, there will be a problem in that pit-shaped recesses will be formed on the surface, and that the low resistance will be hardly achieved without doping with the high concentration additives. Namely, it is impossible to manufacture a semiconductor light-emitting device having a sufficiently low forward voltage. In order to provide the sufficiently low forward voltage, if the high carrier concentration is achieved by increasing the amount of additives, it will be possible to reduce the resistance. There is however a problem in that the crystallinity will be deteriorated due to the increase in amount of additives. The insufficient reduction in the crystal defects can be seen from the XRD half width greater than)100 seconds.

On the other hand, if the total film thickness of the O-doped GaN layer 13 as the first layer and the Si-doped GaN layer 14 as the second layer is greater than 10 μm, it will be possible to provide the low resistance without increasing the amount of additives, i.e., the carrier concentration and without increasing the forward voltage. Further, if the total film thickness of the O-doped GaN layer 13 as the first layer and the Si-doped GaN layer 14 as the second layer is greater than 10 μm, it will be possible to provide the XRD half width which is not smaller than 50 seconds and not greater than 100 seconds, so that it will be possible to manufacture a nitride semiconductor template for a light-emitting diode with excellent crystallinity. There is however a problem in that the large film thickness causes the large warping of the wafer. This warping is due to the fact that the substrate and the epitaxial layer are heterogeneous materials. The increase in warping of the template may cause problems for the growth of a light-emitting portion grown on the template. One example of these problems is the decrease in emission output. In addition, the in-plane distribution of the emission wavelength of the light-emitting diode will be deteriorated under the influence of the warping, thereby cause the decrease in yield. It is because that indium (In) concentration used in the multiple quantum well (MQW) layer as an active layer becomes non-uniform in the plane, due to the warping of the template. There is also a problem in that the manufacturing cost will be increased due to the increase in film thickness.

From the above, the total film thickness of the O-doped GaN layer 13 as the first layer and the Si-doped GaN layer 14 as the second layer is preferably 4 μm to 10 μm, and more preferably 5 to 9 μm with considering the reproducibility and the like.

(The Significance of the Numerical Range of Carrier Concentration and Impurity Concentration)

If the carrier concentration, i.e. impurity concentration is too high, the crystallinity will be deteriorated so that it will be impossible to narrow the XRD half width, namely, the reduction in crystal defects will be insufficient. On the contrary, if the carrier concentration is too low, it will be impossible to lower the surface resistivity. The average carrier concentration of the O-doped GaN layer 13 as the first layer and the Si-doped GaN layer 14 as the second layer preferably falls within the aforementioned numerical range. The average carrier concentration in the thickness direction is based on the evaluation by van der Pauw method. The value measured by van der Pauw method is a carrier concentration value of an entire films, namely, the average carrier concentration of the overall epitaxial layer. For example, if the carrier concentration varies through the film, the value measured by van der Pauw method will be the average carrier concentration in the film. In addition, the impurity concentration can be calculated from the SIMS (Secondary Ion Mass Spectroscopy) analysis.

(The Significance of the Numerical Range of Surface Resistivity of the Template)

The surface resistivity of the entire nitride semiconductor template 10 (the whole epitaxial layer) is preferably not more than 20 Ω/sq. It is desirable that the surface resistivity is not more than 20 Ω/sq, within the preferred range of the film thickness and the preferred range of the carrier concentration. In addition, the surface resistivity of the entire nitride semiconductor template 10 is more preferably 10 to 20 Ω/sq. If the surface resistivity is too low, the crystallinity will be deteriorated.

(Method of Manufacturing the Nitride Semiconductor Template 10)

The template portion in the nitride semiconductor template 10 is preferably grown by the HVPE method, and the growth rate is preferably 30 to 300 μm/hr. By the growth using the HVPE method, it is possible to lower the manufacturing cost, since the cost of raw materials is low, and the growth rate is faster (than the MOVPE method). The reason of determining the growth rate to be 30 to 300 is as follows. If the growth rate is too fast, it will be difficult to control the growth, so that the reproducibility will be deteriorated. The most desirable growth rate is therefore 50 to 200 μm/hr. For the case of forming the films by the HVPE method, GaCl is produced by using a gas such as hydrogen chloride (HCl) as a raw material, and GaCl is used as a Ga source. Accordingly, when the epitaxial layer is grown by the HVPE method, the epitaxial layer will be inevitably contaminated with a slight amount of Cl. For this reason, it is possible to confirm as to whether the epitaxial layer is formed by the HYPE method or not based the analysis of Cl in the epitaxial layer. It is possible to distinguish the epitaxial layer grown by the MOVPE method from the epitaxial layer grown by the HVPE method, since the former is not contaminated with Cl.

(Effects of the First Embodiment)

According to the first embodiment of the present invention, the following effects be obtained:

(a) The low resistance and the reduction in crystal defects can be achieved, so that it is possible to lower the forward voltage and increase the light extraction efficiency. it is possible to manufacture a nitride semiconductor template which can be suitably used in the high efficiency semiconductor light-emitting device.

(b) It is possible to significantly shorten the growth time by forming the nitride semiconductor template with using the HYPE method. As a result, it is possible to provide a nitride semiconductor template for a high performance light-emitting device at a low cost. Namely, this nitride semiconductor template is a template which is useful for fabricating the high-brightness semiconductor light-emitting diode.

(Second Embodiment)

FIG. 2 is a cross-sectional view of a light-emitting diode epitaxial wafer 30 in a second embodiment according to the present invention. The light-emitting diode epitaxial wafer 30 comprises an n-type GaN layer 31 grown on the nitride semiconductor template 10 as shown in FIG. 1A, six pairs of InGaN/GaN multiple quantum well layers 32 grown on the n-type GaN layer 31, and a p-type AlGaN layer 33 and a p-type GaN contact layer 34 grown on the InGaN/GaN multiple quantum well layers 32. Here, the O-doped GaN layer 13 and Si-doped GaN layer 14 are an example of the n-type GaN template layers. The p-type AlGaN layer 33 and the p-type GaN contact layer 34 are an example of the p-type nitride semiconductor layers.

(Third Embodiment)

Figure 3:
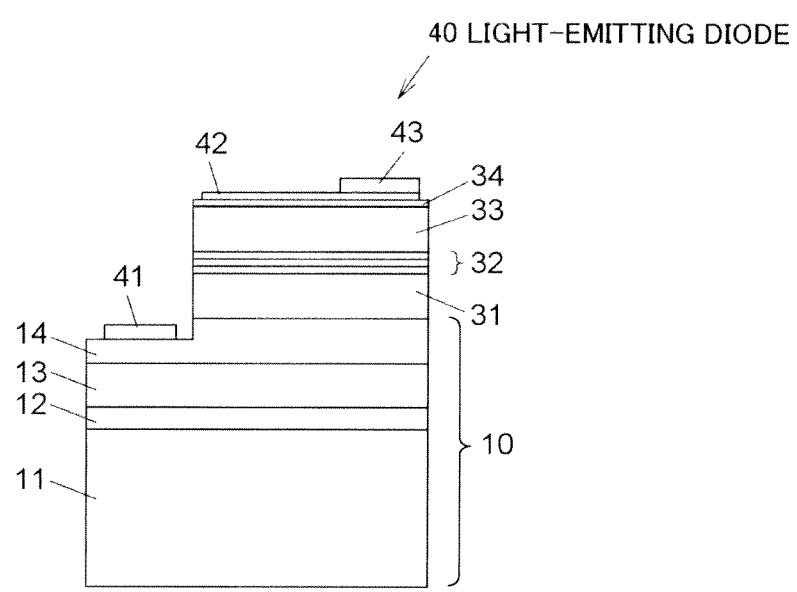
FIG. 3 is a cross-sectional view of a light-emitting diode in a third embodiment according to the present invention.

FIG. 3 is a cross-sectional view of a light-emitting diode 40 in a third embodiment according to the present invention. A surface of the light-emitting diode epitaxial wafer 30 as shown in FIG. 2 was partially removed to expose a part of the Si-doped GaN layer 14 of the nitride semiconductor template 10, and a Ti/Al electrode 41 was formed as an n-type electrode on an exposed part. Further, a Ni/Au semi-transparent electrode 42 as a p-type electrode and an electrode pad 43 were formed on the p-type GaN contact layer 34, to provide a light-emitting diode 40.

Next, the present invention will be described in more detail by the following examples. However, the present invention is not limited thereto.

EXAMPLE 1

Figure 4:
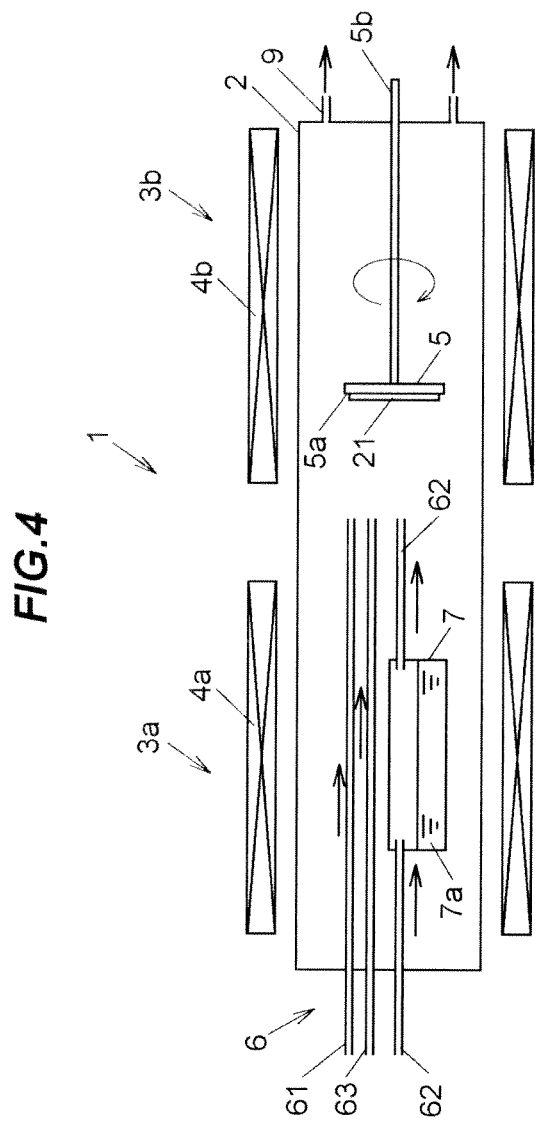
FIG. 4 is a diagram showing an example of schematic configuration of an HYPE apparatus in an example.

FIG. 4 is a diagram showing an example of schematic configuration of an HVPE apparatus 1 in Example 1. In Example 1, the O-doped GaN layer 13 was grown to have a film thickness of about 6 μm on the buffer layer-including PSS substrate 21, and the Si-doped GaN layer 14 was grown to have a film thickness of about 2 μm on the O-doped GaN layer 13, with using the HVPE apparatus 1 as shown in FIG. 4. This HVPE apparatus 1 is divided into a raw material section 3a on an upstream side and a growing section 3b on a downstream side, which are heated by separate raw material section heater 4a and growing section heater 4b to about 850 degrees Celsius and 1100 degrees Celsius, respectively.

Three system gas supply lines 6 of a group V line 61, a group III line 62, and a doping line 63 are installed from the raw material section 3a towards the growing section 3b. From the group V line 61, hydrogen, nitrogen, or a mixture of these gases is supplied as a carrier gas together with ammonia (NH$_3$) as a nitrogen raw material. From the group III line 62, hydrogen, nitrogen, or a mixture of these gases is supplied as a carrier gas together with hydrogen chloride (HCl) to provide chloride gas. In the middle of the Group III line 62, the tank 7 that receives a gallium (Ga) melt 7a is installed. In the tank 7, GaCl gas as a group III source is generated by the reaction of Ga metal and HCl gas and sent to the growing section 3b. From the doping line 63, for the case that the doping is not carried out. e.g., when an undoped GaN layer (un-GaN layer) is grown, a mixture gas of hydrogen and nitrogen is introduced, and when an n-type GaN layer is grown, dichlorosilane (diluted with hydrogen, 100 ppm) as Si source, HCl gas, hydrogen, and nitrogen are introduced.

Further, from the doping line 63, when the baking process is carried out to remove GaN-based deposits attached in the HVPE apparatus 1 after the HVPE growth, HCl gas, hydrogen, and nitrogen are introduced. In the growing section 3b, a tray 5 which rotates at a rotational speed of about 3 to 100 r/min is installed, and a buffer layer-including PSS substrate 21 is installed on a plane (installation plane) 5a which faces to an outlet of each of the gas supply lines 6. The raw material gas flown from the buffer layer-including PSS substrate 21 towards the downstream side is evacuated through an exhaust pipe 9 from a most downstream part. The growth in Example 1 was carried out at normal pressure (1 atm).

The pipe for each of lines 61, 62, and 63, the tank 7, and a rotation shaft 5b of the tray 5 are made of high-purity quartz, and the tray 5 is made of SiC coated carbon.

(1) Preparation of the Substrate

The buffer layer-including PSS substrate 21 having a thickness of 900 μm and a diameter of 100 min (4 inches) provided with protruding portions 11a with a pitch p of 2.5 μm and a height h of 1.5 μm was used.

(2) HVPE Growth

The HVPE growth was carried out as follows. After the buffer layer-including PSS substrate 21 was set on the tray 5 of the HVPE apparatus 1, pure nitrogen was flown thereinto to expel the air in the reactor 2. Next, the buffer layer-including PSS substrate 21 was held for 10 minutes at a substrate temperature of 1100 degrees Celsius in a mixture gas of hydrogen at a flow rate of 3 slm and nitrogen at a flow rate of 7 slm. The O-doped GaN layer 13 is further grown at a growth rate of 60 μm/hr. As to the flow rate of each gas for process, HCl, hydrogen and nitrogen were flown from the group III line 62 at 50 sccm, 2 slm, and 1 slm, respectively, and $NH_3$ and hydrogen were flown from the group V line 61 at 2 slm and 1 slm, respectively. From the doping line 63, oxygen (O) was introduced. The introduction of oxygen (O) was stopped, when the O-doped GaN layer 13 was grown to have a thickness of about 2 μm.

The growth time was 6 minutes. After the O-doped GaN layer 13 was grown as the first layer, the Si-doped GaN layer 14 was grown as the second layer by introducing Si from the Si doping line 63 for 2 minutes under the same basic growth conditions as those of the first layer. Thereafter, $NH_3$ and nitrogen were flown at 2 slm and 8 slm, respectively, and the substrate temperature was cooled down until around a room temperature. Thereafter, the nitrogen purging was carried out for several dozens of minutes such that a nitrogen atmosphere was provided in the reactor 2, then the nitride semiconductor template 10 as shown in FIG. 1A was taken out.

The XRD half width of the nitride semiconductor template 10 produced as described above was 73.8 seconds. In addition, the surface resistivity of the nitride semiconductor template 10 was measured with using a non-contact type resistivity measuring apparatus, and the surface resistivity was 15 Ω/sq.

The growth of only the O-doped GaN layer 13 as the first layer and only the Si-doped GaN layer 14 as the second layer of the nitride semiconductor template 10 was further carried out to confirm the average carrier concentration thereby by van der Pauw method. In the growth of only the O-doped GaN layer 13 as the first layer, the average carrier concentration of $1 \times 10^{188}$ cm$^{-3}$ was confirmed. In the growth of only the Si-doped GaN layer 14 as the second layer, the average carrier concentration of $4.5 \times 10^{18}$ cm$^{-3}$ was also confirmed.

Figure 5:
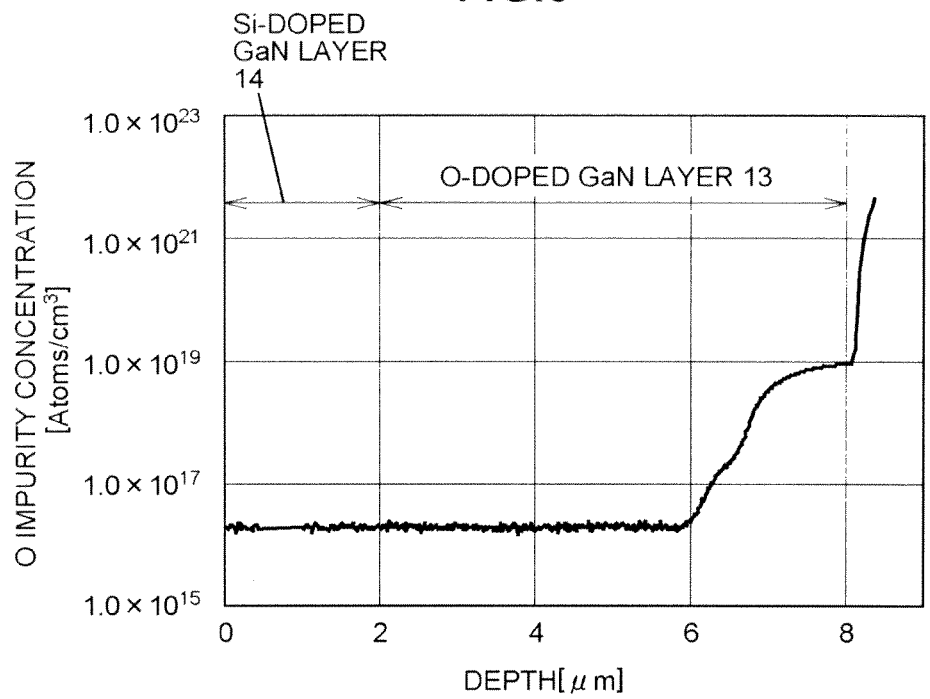
FIG. 5 is a graph showing an O (oxygen) concentration profile in an O-doped GaN layer 13 (first layer) and a Si-doped GaN layer 14 (second layer) with an SIMS (Secondary Ion Spectroscopy) analysis.
Figure 6:
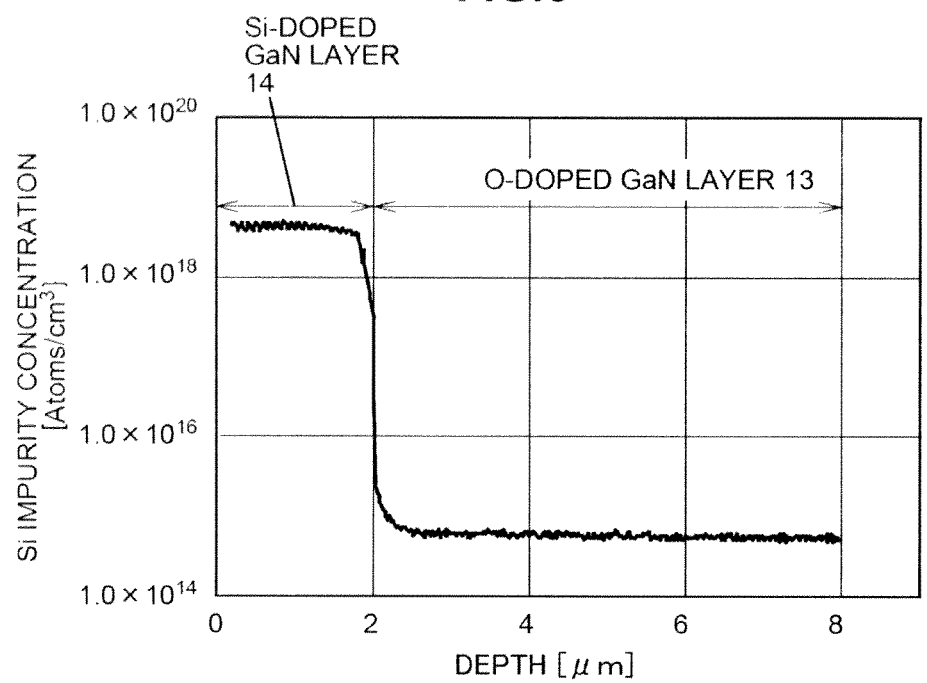
FIG. 6 is a graph showing a Si (silicon) concentration profile in the O-doped GaN layer 13 (first layer) and the Si-doped GaN layer 14 (second layer) with the SIMS (Secondary Ion Mass Spectroscopy) analysis.

FIG. 5 is a graph showing an O (oxygen) concentration profile in an O-doped GaN layer 13 (first layer) and a Si-doped GaN layer 14 (second layer) with an SIMS (Secondary Ion Mass Spectroscopy) analysis and FIG. 6 is a graph showing a Si (silicon) concentration profile in the O-doped GaN layer 13 (first layer) and the Si-doped GaN layer 14 (second layer) with the SIMS (Secondary Ion Mass Spectroscopy) analysis. The O impurity concentration was not more than $3 \times 10^{19}$ cm$^{-3}$ as shown in FIG. 5. The Si impurity concentration was not more than $5 \times 10^{18}$ cm$^{-3}$ as shown in FIG. 6.

Figure 7:
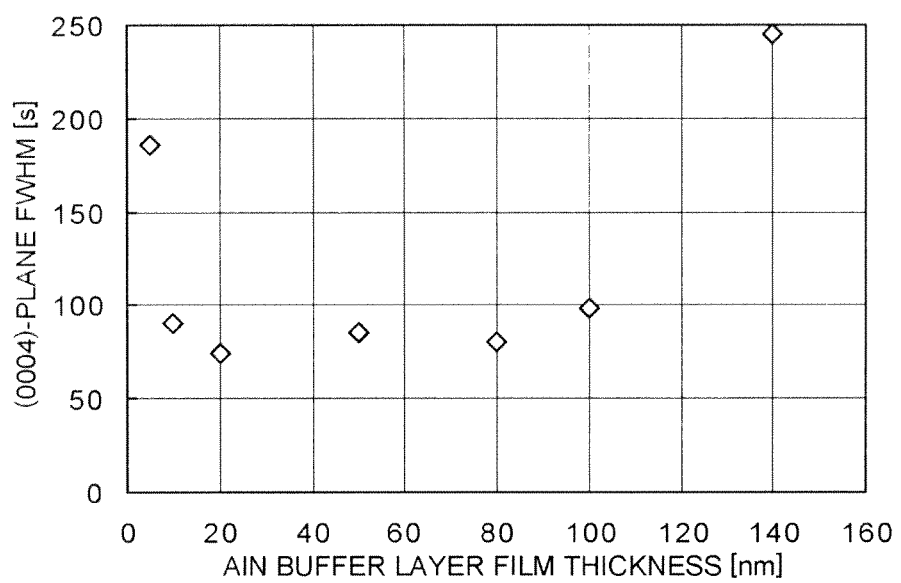
FIG. 7 is a graph showing the relationship between film thickness and XRD half width of the AlN buffer layer.

FIG. 7 is a graph showing the relationship between film thickness and XRD half width of the AlN buffer layer 12. It can be understood that the XRD half width is small when the film thickness of the AlN buffer layer 12 is within a range of 10 to 100 nm.

Figure 8:
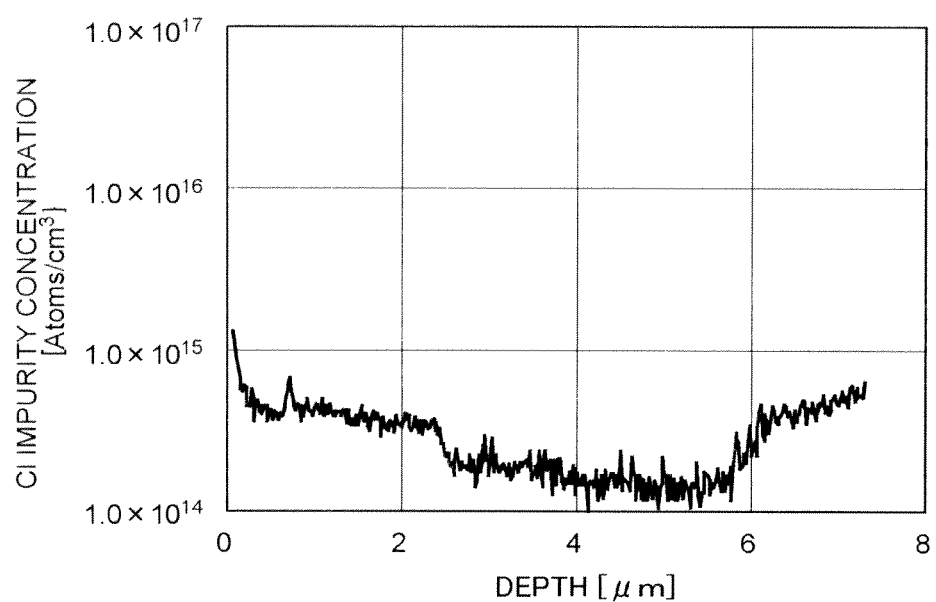
FIG. 8 is a graph showing the results of SIMS analysis of Cl in a nitride semiconductor template in Example 1.

FIG. 8 is a graph showing the results of SIMS analysis of Cl in a nitride semiconductor template 10 in Example 1. It can be seen that the nitride semiconductor template 10 was manufactured by the HVPE method, since Cl appears in the epitaxial layer.

(3) Epitaxial Growth for Manufacturing a Light-emitting Diode

On the nitride semiconductor template 10 as shown in FIG. 1A, the epitaxial growth for manufacturing the light-emitting diode was carried out by the MOVPE method.

More specifically, an n-type GaN layer 31 was grown on the nitride semiconductor template 10, six pairs of InGaN/GaN multiple quantum well layers 32 were grown on the n-type GaN layer 31, and a p-type AlGaN layer 33 and a p-type GaN contact layer 34 were grown on the InGaN/GaN multiple quantum well layers 32. After the growth of the laminated structure described above, the temperature of the reactor 2 was lowered to near the room temperature, then a light-emitting diode epitaxial wafer 30 as shown in FIG. 2 was obtained.

(4) Formation of the Light-emitting Diode

Thereafter, as shown in FIG. 3, a surface of the light-emitting diode epitaxial wafer 30 as shown in FIG. 2 was partially removed by RIE (Reactive Ion Etching) to expose a part of the Si-doped GaN layer 14 of the nitride semiconductor template 10, and a Ti/Al electrode 41 was formed as an n-type electrode on an exposed part. Further, a Ni/Au semi-transparent electrode 42 as a p-type electrode and an electrode pad 43 were formed on the p-type GaN contact layer 34, to provide a light-emitting diode 40.

The emission characteristic of the light-emitting diode 40 was evaluated at a flowing current of 20 mA. The emission peak wavelength was about 450 nm, a forward voltage was 3.25 V, and the emission output was 30 mW. In addition, the reliability test of the light-emitting diode 40 was carried out by electric current applying test for 1000 hr at a flowing current of 50 mA and at a room temperature. As a result, the relative output was 98%, so that a sufficiently good reliability characteristic was confirmed. Here, "relative output"=" (emission output after current flow for 168 hours/initial emission output)×100".

EXAMPLE 2

The nitride semiconductor template 10 in Example 2 was prepared under the same condition as that of the nitride semiconductor template 10 in Example 1, except that the gases supplied from the III group line during the growth of the O-doped GaN layer 13 and the Si-doped GaN layer 14 were HCl at a flow rate of 50 sccm, hydrogen at a flow rate of 3.0 slm with no nitrogen (i.e. nitrogen at a flow rate of 0 slm), and the entire film thickness of the nitride semiconductor layers 22 was about 10 μm. Thereafter, the experiments similar to those in Example 1 were carried out. As a result, the XRD half width of the nitride semiconductor template 10 in Example 2 was 50 seconds which is narrower than that in Example 1, and the surface resistivity was 15 Ω/sq which is similar to that in Example 1. According to the SIMS analysis, the O impurity concentration in the O-doped GaN layers 13 as the first layer was not more than $1.0\times10^{19}$ cm$^{-3}$ and the Si concentration in the Si-doped GaN layer 14 as the second layer was $4.0\times10^{18}$ cm$^{-3}$ that are similar to those in Example 1.

EXAMPLE 3

The nitride semiconductor template 10 in Example 3 was prepared under the same condition as that of the nitride semiconductor template 10 in Example 1, except that the pitch p of the protruding portion 11*a* of the PSS substrate 11 was 0.5 to 6.0 μm, and the height h thereof was 0.5 to 3.0 μm. Thereafter, the experiments similar to those in Example 1 were carried out. As a result, the results similar to those in Example 1 were obtained.

COMPARATIVE EXAMPLE 1

Figure 9:
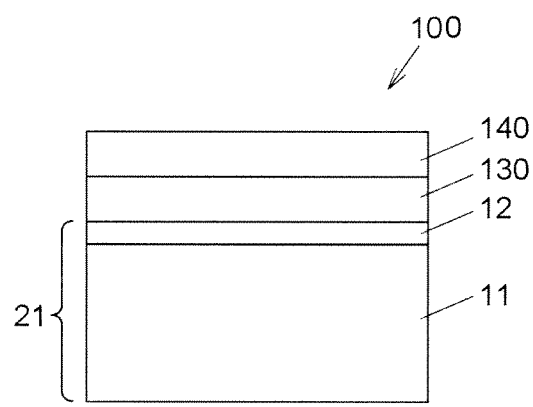
FIG. 9 is a cross-sectional view showing a nitride semiconductor template in Comparative Example 1.

FIG. 9 shows a nitride semiconductor template 100 in Comparative Example 1. The basic structure ride semiconductor template 100 in Comparative Example 1 is the same as the structure of Example 1 shown in FIG. 1A. Growth conditions, etc. in Comparative Example 1 were also the same as those of Example 1. Therefore, only different items from in Example 1 will be discussed below.

In Comparative Example 2, an undoped GaN layer 130 was grown as a first layer to have a thickness of about 6 μm, and a Si-doped GaN layer 140 was grown as a second layer on the undoped GaN layer 130 to have a thickness of about 2 μm. The Si-doped GaN layer 140 was designed to have an average carrier concentration of $8.5\times10^{18}$ cm$^{-3}$ at this time. Thereafter, the average carrier concentration of the Si-doped GaN layer 140 was checked and it is confirmed that the average carrier concentration thereof was $8.5\times10^{18}$ cm$^{-3}$.

In Comparative Example 1, the undoped GaN layer 130 is provided as the first layer of the nitride semiconductor template 100, since the undoped GaN layer is generally preferable to reduce the crystal defects. The carrier concentration of the Si-doped GaN layer 140 as the second layer is increased, since the first layer is undoped. If the carrier concentration of the Si-doped GaN layer 140 as the second layer is not increased, the surface resistivity will be increased, so that the forward voltage will be increased when the nitride semiconductor template 100 is used for the light-emitting diode.

As a result, the XRD half width of the nitride semiconductor template 100 produced as described above in Comparative Example was 117.6 seconds. Namely, the XRD half width in Example 1 is narrower for about 44 seconds than that in Comparative Example 1, i.e. about 60% of Comparative Example 1. In addition, the surface resistivity of the nitride semiconductor template 100 was measured with using a non-contact type resistivity measuring apparatus, and the surface resistivity was 16 Ω/sq, which is similar to that in Example 1.

The epitaxial growth for manufacturing the light-emitting diode was performed on the nitride semiconductor template 100 by the MOVPE method. The growth by the MOVPE method was carried out under the same conditions as in Example 1. The film formation by the MOVPE method for the nitride semiconductor template 10 in Example 1 and the nitride semiconductor template 100 in Comparative Examples were carried out simultaneously in the same MOVPE apparatus for plural pieces.

The emission characteristic of the light-emitting diode in Comparative Example 1 was evaluated at a flowing current of 20 mA. The emission peak wavelength was about 450 nm, a forward voltage was 3.22 V, and the emission output was 18 mW. From the above fact that the XRD half width is broadened, the internal quantum efficiency is deteriorated due to the crystal defects. In other words, the internal quantum efficiency is enhanced, thereby the emission output is increased in Example 1.

In Comparative Example 1, the reliability test of the light-emitting diode was carried out by electric current applying test for 1000 hr at a flowing current of 50 mA and at a room temperature. As a result, the relative output was 87%, so that the reliability characteristic was not good. Here, "relative output"="(emission output after current flow for 168 hours/initial emission output)×100".

COMPARATIVE EXAMPLE 2

Figure 10:
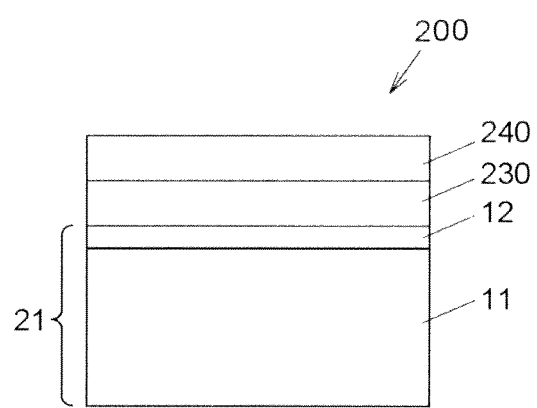
FIG. 10 shows a nitride semiconductor template in Comparative Example 2.

FIG. 10 shows a nitride semiconductor template 200 in Comparative Example 2. The basic structure of the nitride semiconductor template 200 in Comparative Example 2 is the same as the structure of Example 1 and Comparative Example 1 shown in FIG. 1A. Growth conditions, etc. are also the same as those of Example 1 and Comparative Example 1. Therefore, only different items from in Example 1 will be discussed below.

In Comparative Example 1, from the advantageous point of view of crystallinity improvement, an undoped GaN layer 130 was grown as a first layer to have a thickness of about 6 μm, and a Si-doped GaN layer 140 was grown as a second layer to have a thickness of 2 μm on the undoped GaN layer 130. At this point, the average carrier concentration of the Si-doped GaN layer 140 was $8.5\times10^{18}$ cm$^{-3}$. It is considered that the crystallinity was deteriorated since the average carrier concentration of the Si-doped GaN layer 140 as a top layer was too high. In other words, it is considered that the XRD half width was broadened due to the crystallinity deterioration resulting from the high carrier concentration in the Si-doped GaN layer 140 as the second layer.

Accordingly, the comparative experiment (Comparative Example 2) was conducted with a general method of lowering the carrier concentration in a Si-doped GaN layer 240 as a top layer.

To lower the carrier concentration of the Si-doped GaN layer 240 as the top layer to reduce the surface resistivity, it is sufficient to add Si to the first layer and lower the carrier concentration of the Si-doped GaN layer 240 as the top layer in the corresponding amount. Accordingly, in Comparative Example 2, Si was also added to the first layer of the nitride semiconductor template 200, to form a Si-doped GaN layer 230. The average carrier concentration in the first layer in this case was designed to be $1.0\times10^8$ cm$^{-3}$. At the same time, the average carrier concentration in the second layer Si-doped GaN layer 240 was also designed to be $1.0\times10^{18}$ cm$^{-3}$. That is, in the structure, the Si-doped GaN layers with the average carrier concentration of $1.0\times10^{18}$ cm$^{-3}$ were grown to have a thickness of about 8 μm in total. Of course, it was confirmed that the average carrier concentration was the design value.

The XRD half width of the nitride semiconductor template 200 produced as described above was 125.8 seconds. That is, the crystallinity is rather worse than in Comparative Example 1. In addition, the surface resistivity measured by using a non-contact resistivity measuring apparatus was 16 Ω/sq, which was the same as in Example 1 and Comparative Example 1.

The epitaxial growth for manufacturing the light-emitting diode was performed on the nitride semiconductor template 200 by the MOVPE method. The growth by the MOVPE method was carried out under the same conditions as in Example 1. The film formation by the MOVPE method for the nitride semiconductor template 10 in Example 1 and the nitride semiconductor templates 100, 200 in Comparative Examples 1, 2 were carried out simultaneously in the same MOVPE apparatus for plural pieces.

The emission characteristic of the light-emitting diode in Comparative Example 1 was evaluated at a flowing current of 20 mA. The emission peak wavelength was about 450 nm and a forward voltage was 3.23 V. For this, it was confirmed that the emission peak wavelength and the forward voltage were the same as in Example 1 and Comparative Example 1. However, the emission output was 16 mW, and is lower than in Example 1. The result was poorer than in Comparative Example 1.

The reliability test of the light-emitting diode in Comparative Example 2 was carried out by electric current applying test for 1000 hr at a flowing current of 50 mA and at a room temperature. As a result, the relative output was 82%, so that the reliability characteristic was poorer than that in Comparative Example 1. Here, "relative output"="(emission output after current flow for 168 hours/initial emission output)× 100". It is considered that since the XRD half width is broadened, the emission output and the reliability worsened due to the incease of crystal defects (the deterioration of the crystallinity).

(Variation 1)

The present invention basically relates to the nitride semiconductor template, more particularly, to its structure and film formation conditions. For this reason, it is obvious that a similar effect can be obtained even if the shape of the protruding portion 11a of the PSS substrate is changed.

(Variation 2)

Although the growth rate is 60 μm/hr, it is clear that the present invention can be applied even if the growth rate is increased up to about 300 μm/hr.

(Variation 3)

Since the present invention relates to the GaN based film provided on the substrate, it is obvious that the intended effect of the present invention can be obtained even by using a flat substrate.

(Variation 4)

Since the present invention relates to the GaN based film provided on the substrate, it is obvious that the intended effect of the present invention can be obtained even if the buffer layer is not an AlN film.

(Variation 5)

In the n-type group III nitride semiconductor layer, the oxygen concentration and the Si concentration may be gradually changed. In addition, in the entire O-doped GaN layer 13, oxygen may homogeneously be doped.

Incidentally, the present invention is not limited to the above-described embodiments and the above-described examples, but various modifications may be made without altering the gist of the invention. The O impurity concentration in the thickness direction of the first group III nitride semiconductor may be lower than the Si carrier concentration in the first group-III nitride semiconductor.

Although the invention has been described with respect to the specific embodiments for complete and clear disclosure, the appended claims are not to be thus limited but are to be construed as embodying all variations and alternative constructions that may occur to one skilled in the art which fairly fall within the basic teaching herein set forth.

What is claimed is:

1. A nitride semiconductor template, comprising:
    a substrate; and
    a group III nitride semiconductor layer comprising an oxygen-doped layer formed on the substrate, and a silicon-doped layer formed on the oxygen-doped layer,
    wherein a total thickness of the group III nitride semiconductor layer is not smaller than 4 μm and not greater than 10 μm, and
    wherein an average silicon carrier concentration in the silicon-doped layer is not lower than $1 \times 10^{18}$ cm$^{-3}$ and not higher than $5 \times 10^{18}$ cm$^{-3}$.

2. The nitride semiconductor template according to claim 1, wherein an oxygen impurity concentration in the oxygen-doped layer is not lower than $1 \times 10^{16}$ cm$^{-3}$ and not higher than $3 \times 10^{19}$ cm$^{-3}$, and an average carrier concentration in the oxygen-doped layer is not lower than $0.8 \times 10^{18}$ cm$^{-3}$ and not higher than $1 \times 10^{18}$ cm$^{-3}$.

3. The nitride semiconductor template according to claim 1, wherein a surface resistivity is not less than 10 Ω/sq and not more than 20 Ω/sq.

4. The nitride semiconductor template according to claim 1, wherein a full width at half maximum of a (0004) plane of X-ray diffraction is not less than 50 seconds and not more than 100 seconds.

5. The nitride semiconductor template according to claim 1, wherein the group III nitride semiconductor layer comprises a GaN-based layer.

6. The nitride semiconductor template according to claim 5, further comprising an aluminum nitride buffer layer between the GaN-based layer and the substrate.

7. The nitride semiconductor template according to claim 6, wherein a thickness of the aluminum nitride buffer layer is not less than 10 nm and not more than 100 nm.

8. The nitride semiconductor template according to claim 1, wherein a surface of the substrate comprises a plurality of protrusions.

9. The nitride semiconductor template according to claim 1, wherein the group III nitride semiconductor layer is grown by Hydride Vapor Phase Epitaxy.

10. A light-emitting diode, comprising:
    a sapphire substrate;
    an aluminum nitride buffer layer formed on the sapphire substrate;
    an n-type group III nitride semiconductor layer formed on the aluminum nitride buffer layer;
    a multiple quantum well layer formed on the n-type group III nitride semiconductor layer;
    a p-type nitride semiconductor layer formed on the multiple quantum well layer;
    an exposed portion of the n-type group III nitride semiconductor layer formed by etching from the p-type nitride semiconductor layer to the n-type group III nitride semiconductor layer;
    an n-type electrode formed on the exposed portion of the n-type group III nitride semiconductor layer; and
    a p-type electrode formed on the p-type nitride semiconductor layer,
    wherein the n-type group III nitride semiconductor layer comprises a stacked structure comprising an oxygen-doped layer formed on the aluminum nitride buffer layer, and a silicon-doped layer formed on the oxygen-doped layer,
    wherein a total thickness of the group III nitride semiconductor layer is not smaller than 4 μm and not greater than 10 μm, and
    wherein an average silicon carrier concentration in the silicon-doped layer is not lower than $1 \times 10^{18}$ cm$^{-3}$ and not higher than $5 \times 10^{18}$ cm$^{-3}$.

11. The nitride semiconductor template according to claim 1, wherein an n-type electrode is disposed on an exposed portion of the group III nitride semiconductor layer.

12. The nitride semiconductor template according to claim 1, wherein an upper surface of the group III nitride semiconductor layer comprises an etched portion.

13. The nitride semiconductor template according to claim 1, wherein the total thickness of the group III nitride semiconductor layer includes a sum of a thickness of the oxygen-doped layer and a thickness of the silicon-doped layer formed on the oxygen-doped layer.

14. The nitride semiconductor template according to claim 13, wherein the total thickness of the group III nitride semiconductor layer is in a range from 5 μm to 9 μm.

15. The nitride semiconductor template according to claim 13, wherein an oxygen impurity concentration in the oxygen-doped layer is in a range from $0.9 \times 10^{18}$ cm$^{-3}$ to $3 \times 10^{19}$ cm$^{-3}$, and the average silicon carrier concentration in the silicon-doped layer is in a range from $1 \times 10^{18}$ cm$^{-3}$ to $4 \times 10^{18}$ cm$^{-3}$.

16. The light-emitting diode according to claim 10, wherein a surface of the substrate comprises a plurality of protrusions.

17. The light-emitting diode according to claim 10, wherein the total thickness of the n-type group III nitride semiconductor layer includes a sum of a thickness of the oxygen-doped layer and a thickness of the silicon-doped layer formed on the oxygen-doped layer.

18. The light-emitting diode according to claim 17, wherein the total thickness of the group III nitride semiconductor layer is in a range from 5 μm to 9 μm.

19. The light-emitting diode according to claim 10, wherein the total thickness of the group III nitride semiconductor layer is in a range from 5 μm to 9 μm.

20. The light-emitting diode according to claim 10, wherein an oxygen impurity concentration in the oxygen-doped layer is in a range from $0.9 \times 10^{18}$ cm$^{-3}$ to $3 \times 10^{19}$ cm$^{-3}$, and the average silicon carrier concentration in the silicon-doped layer is in a range from $1 \times 10^{18}$ cm$^{-3}$ to $4 \times 10^{18}$ cm$^{-3}$.

* * * * *